(12) United States Patent
Yamauchi et al.

(10) Patent No.: US 8,748,062 B2
(45) Date of Patent: Jun. 10, 2014

(54) METHOD OF CLEANING SUBSTRATE

(75) Inventors: Kazuto Yamauchi, Suita (JP); Tsutomu Shoki, Shinjuku-ku (JP); Takeyuki Yamada, Shinjuku-ku (JP)

(73) Assignees: Osaka University, Osaka (JP); Hoya Corporation, Tokyo (JP)

( * ) Notice: Subject to any disclaimer, the term of this patent is extended or adjusted under 35 U.S.C. 154(b) by 0 days.

(21) Appl. No.: 13/455,740

(22) Filed: Apr. 25, 2012

(65) Prior Publication Data

US 2012/0276474 A1     Nov. 1, 2012

(30) Foreign Application Priority Data

Apr. 26, 2011   (JP) .................................. 2011-098480

(51) Int. Cl.
*B08B 3/04* (2006.01)
*B08B 3/02* (2006.01)

(52) U.S. Cl.
USPC ................................. 430/5; 134/34; 134/95.3

(58) Field of Classification Search
USPC ............... 430/5, 30; 134/34, 95.1, 95.2, 95.3; 378/35
See application file for complete search history.

(56) References Cited

U.S. PATENT DOCUMENTS

| 6,699,625 B2 | 3/2004 | Lee et al. |
| 8,016,949 B2 * | 9/2011 | Jayaraman et al. ............. 134/36 |
| 8,021,804 B2 * | 9/2011 | Okubo et al. ..................... 430/5 |
| 8,414,708 B2 * | 4/2013 | Jeong et al. ..................... 134/30 |

FOREIGN PATENT DOCUMENTS

| JP | 2000-173965 A | 6/2000 |
| JP | 2001-96241 A | 4/2001 |
| JP | 2002-122981 A | 4/2002 |
| JP | 2005-221928 A | 8/2005 |
| JP | 2007-201186 A | 8/2007 |
| JP | 2008-226900 A | 9/2008 |

* cited by examiner

*Primary Examiner* — Stephen Rosasco
(74) *Attorney, Agent, or Firm* — Sughrue Mion, PLLC

(57) ABSTRACT

The present invention is a method of cleaning a substrate, comprising cleaning at least one surface of a substrate located in a liquid by injecting pressurized cleaning liquid containing bubbles or cleaning particles from a injection nozzle to at least one surface of the substrate.

7 Claims, 2 Drawing Sheets

73  71  72

METHOD OF CLEANING SUBSTRATE

TECHNICAL FIELD

The present invention relates to a method of manufacturing a mask blank substrate used for fabrication of a transfer mask, such as a photomask used in manufacture of an electronic device like a semiconductor device, a mask blank and a transfer mask, and a method of cleaning a transfer mask.

BACKGROUND OF THE INVENTION

In general, in the manufacturing processes of a semiconductor device, a fine pattern is formed using photolithography. For the formation of a fine pattern, many substrates called as photomasks are normally used. Herein, a substrate used for formation of a fine pattern using photolithography, such as a photomask, and the substrate provided with a transfer pattern is referred to as "a transfer mask". In general, this transfer mask is equipped with a fine pattern made of a metal thin film or the like on a transparent glass substrate. Photolithography is used for the manufacture of a transfer mask.

For the manufacture of a transfer mask by photolithography, a mask blank is used. The mask blank has a thin film, such as light shielding film, for formation of a transfer pattern on a transparent substrate, such as a glass substrate. Herein, a transfer pattern may also be referred to as "a mask pattern". Manufacture of a transfer mask using the mask blank comprises steps of: exposing to form a desired pattern to a resist film formed on a mask blank; developing the resist film in accordance with the desired pattern to form a resist pattern; etching the thin film in accordance with the resist pattern; and stripping and removing the remained resist pattern. In the developing step, after forming the desired pattern to the resist film formed on the mask blank, developer is supplied to dissolve a portion of the resist film soluble in the developer for formation of the resist pattern. In the etching step, using this resist pattern as a mask, a portion of the exposed thin film where the resist pattern is not formed is dissolved by dry etching or wet etching, thereby forming the desired mask pattern on the transparent substrate. Thus, a transfer mask is produced.

In the steps of manufacturing a glass substrate for a mask blank used for manufacture of the transfer mask, cleaning is performed for the glass substrate after mirror polishing for removing particles, such as a foreign substance, for example, on a surface of the substrate. Conventionally, several methods are known for the cleaning.

For example, in Japanese Laid-Open Patent [Kokai] Publication No. 2000-173965, a cleaning method using a high speed shear flow is disclosed. In the cleaning method using a high speed shear flow described in Japanese Laid-Open Patent [Kokai] Publication No. 2000-173965, objects to be cleaned and high pressure nozzles are disposed at predetermined intervals in a process tank mainly of ultrapure water, and high speed shear flow of the ultrapure water injected from the high pressure nozzles are generated near the surfaces of the objects to be cleaned. With the high speed shear flow, fine foreign substances attached to the surfaces of the objects to be cleaned are stripped by breaking the bond with the surfaces of the objects to be cleaned. Further, the high speed shear flow prevents the removed foreign substances from reattaching to the surfaces of the objects to be cleaned.

In Japanese Laid-Open Patent [Kokai] Publication No. 2007-201186, an apparatus for cleaning a substrate is disclosed, which cleans a substrate by supplying a cleaning fluid to one surface of a surface to be cleaned. The apparatus for cleaning substrate of Japanese Laid-Open Patent [Kokai] Publication No. 2007-201186 comprises a cleaning fluid supply unit supplying a cleaning fluid to the surface of the substrate to be cleaned, equipped towards a surface of a substrate to be cleaned, and a cleaning roller equipped towards the surface of the substrate to be cleaned so as to be approximately parallel to the cleaning fluid supply unit and also feeding the cleaning fluid into a gap formed with the surface of the substrate to be cleaned by rotation.

In addition, as a cleaning method for removing particles on a substrate surface, there is a method of cleaning a substrate surface by striking cleaning water with ultrasonic of about 1 MHz applied directly to the substrate surface. This cleaning is referred to as "megasonic cleaning".

As one example of the megasonic cleaning, Japanese Laid-Open Patent [Kokai] Publication No. 2001-96241 discloses a method of cleaning a precision substrate, such as a mask blank substrate, using a cleaning fluid made by mixing ozonized water or anode water with hydrogenated water or cathode water, and applying ultrasonic to the cleaning fluid. In addition, Japanese Laid-Open Patent [Kokai] Publication No. 2005-221928 discloses that the megasonic cleaning is performed, for example, with supplying a cleaning fluid, with ultrasonic applied thereto, to a surface of a transparent substrate, after etching process on a surface of a transparent substrate using an etching fluid, as an example of physical cleaning utilizing a physical action for removing foreign substances attached on the substrate surface.

In addition, in recent years, as a method of cleaning a substrate to clean a substrate surface, such as a semiconductor wafer, a two-fluid-jet cleaning method is used. For example, a cleaning method for removing contaminants on a substrate surface using the two-fluid-jet cleaning method is described in Japanese Laid-Open Patent [Kokai] Publication No. 2008-226900.

On the other hand, in recent years, because of a demand for miniaturization of semiconductor devices, there is an exposure technique using an extreme ultraviolet light. Hereinafter, an extreme ultraviolet is referred to as "EUV". EUV lithography is highly expected, which is one of reflective lithography. Here, EUV light refers to light in a wavelength band of the soft x-ray region or the vacuum ultraviolet region, and specifically to light having a wavelength approximately from 0.2 to 100 nm. As a mask used for the EUV lithography, a reflective mask for exposure described in Japanese Laid-Open Patent [Kokai] Publication No. 2002-122981, for example, is proposed.

The reflective mask described above has a multilayer reflective film to reflect exposure light formed on a substrate and has an absorber film with a pattern formed on the multilayer reflective film to absorb exposure light. Light introduced to a reflective mask mounted to an exposure apparatus (a pattern transfer apparatus) is absorbed in an area with the absorber film, and an optical image reflected by the multilayer reflective film in an area without the absorber film through a reflective optical system is transferred on a semiconductor substrate.

BRIEF SUMMARY OF THE INVENTION

In recent years, an ArF excimer laser is applied to the exposure light for a transfer mask to which light-transmitting photolithography is applied. In addition, there has been significant miniaturization of transfer patterns in transfer masks. Therefore, demands for the defect size and a number thereof required to mask blanks have also become strict. One of the major factors of generating convex defects in a thin film for pattern formation of a mask blank is attachment of foreign substances on a surface of a substrate before forming a thin film. Therefore, it is important to remove foreign substances from a surface where a thin film forms.

In contrast, in a case of the EUV reflective mask blank, its demand for surface defects is extremely strict. In a case of fabricating a reflective mask blank or a reflective mask using a glass substrate with convex defects due to attachment of foreign substances and the like on the substrate surface, when the convex defects are near the pattern on the mask surface, a phase change due to the convex defects occurs in a reflected light of the exposure light. This phase change causes deterioration in the positional accuracy and the contrast of the transferred pattern. Particularly in a case of using light having a short wavelength, such as EUV light, as the exposure light, the phase change becomes very sensitive to minute concavity and convexity on the mask surface and thus the transfer image is greatly influenced, so that the phase change derived from minute concavity and convexity is not a negligible problem. In addition, the EUV reflective mask blank has a multilayer reflective film with, for example, Mo and Si layers having each thickness of several nanometers being laminated alternately from about 40 to 60 cycles. Therefore, even if there are small convex defects that look like that they do not cause any particular problem on the substrate surface, the size of the defects on the substrate surface is enlarged upon forming the multilayer reflective film, and convex defects with sizes potentially causing phase defects on a surface of the multilayer reflective film are sometimes generated. For such reasons, particularly in a case of the EUV reflective mask blank, it is required to satisfy the conditions at a very high level to the surface defects.

In the cleaning method using a high speed shear flow, with regards to relatively large foreign substances, for example, foreign substances in a size of the 100 nm order or more, it is possible to wash out the foreign substances on the substrate surface with the high speed shear flow. However, even if the high speed shear flow strikes on a surface of a substrate, high speed shear flow is hard to act on relatively small foreign substances, for example, foreign substances in a size of less than 100 nm. The reason is assumed that, since a high speed shear flow is a flow of a liquid, the flow rate of the high speed shear flow greatly decreases near the substrate surface because of the viscosity of the liquid. Therefore, it is difficult to remove foreign substances in a relatively small size from a surface of a substrate with the cleaning method using a high speed shear flow.

In order to clean a substrate used for a mask blank, megasonic cleaning is sometimes used. However, the present inventor has found that the conventional megasonic cleaning had the following problems. That is, in such a megasonic cleaning method, in a case of cleaning by striking a cleaning liquid with ultrasonic at low frequencies relatively lower in the MHz band applied directly to a surface of a glass substrate, the action of stripping deposits on the substrate surface is high and a very high cleaning effect is obtained. However, the vibration given by the ultrasonic to the molecular structure constituting an surface layer of the glass substrate is also great, and thus latent defects are sometimes generated in an area of weaker bonding structure inside the glass substrate compared with the surrounding area of the glass substrate. By a conventional defect inspection for substrates, it is very difficult to find such latent defects. Therefore, a substrate comprising latent defects on the surface layer is sometimes sent to a thin film formation step, which is the next step, then thin film for transfer pattern is formed, and a mask blank having the substrate comprising latent defects on the surface layer is shipped as a mask blank of an acceptable product.

With that, the present invention is made to solve the problems in a case of using a conventional cleaning method, such as cleaning using a high speed shear flow and megasonic cleaning, for example, and to obtain an appropriate cleaning method even for cleaning of a substrate for a light-transmitting transfer mask and a substrate for an EUV reflective mask blank. It is an object of the present invention to provide a method of cleaning a substrate, such as a mask blank substrate, which is capable of inhibiting generation of latent defects inside a glass substrate during cleaning the mask blank substrate and also capable of certainly removing particles on a main surface of the substrate. It is also an object of the present invention to provide a method of manufacturing a mask blank substrate, a method of manufacturing a mask blank, a method of manufacturing a reflective mask, and a method of manufacturing a transfer mask that use the cleaning method.

It is also an object of the present invention to provide a substrate with a multilayer reflective film and a reflective mask blank that are high quality with a reduced number of tiny convex defects to satisfy high level demands for defect quality and a method of manufacturing the same.

It is also an object of the present invention to provide an apparatus for cleaning substrate to be used for a method of cleaning a substrate, such as a mask blank substrate, which is capable of inhibiting generation of latent defects inside a glass substrate during cleaning the mask blank substrate and also capable of certainly removing particles on a main surface of the substrate.

As a result of intensive studies to solve the problems, the present inventor has found that a cleaning method using pressurized cleaning liquid comprising bubbles or cleaning particles. By using the method of cleaning a substrate of the present invention, it is possible to inhibit generation of latent defects inside a glass substrate, which becomes a problem in a case of megasonic cleaning, and it is also possible to certainly remove a particle on a main surface of a substrate and a surface of a thin film for transfer pattern formation on a mask blank, particularly removing micro particles equivalent to less than 100 nm, for example. In order to solve the problems, the present invention comprises the following configurations.

The present invention is a method of cleaning a substrate according to Configurations 1 through 5 below.

Configuration 1

Configuration 1 is a method of cleaning a substrate, comprising cleaning at least one surface of the substrate located in a liquid by injecting pressurized cleaning liquid containing bubbles or cleaning particles from a injection nozzle to at least one surface of the substrate.

Configuration 2

Configuration 2 is the method of cleaning the substrate according to Configuration 1, wherein the cleaning liquid is pure water.

Configuration 3

Configuration 3 is the method of cleaning the substrate according to Configuration 2, wherein the cleaning liquid further contains a surfactant.

Configuration 4

Configuration 4 is the method of cleaning the substrate according to Configuration 2 or 3, wherein the cleaning liquid further contains an acidic substance or an alkaline substance.

Configuration 5

Configuration 5 is the method of cleaning the substrate according to any one of Configurations 1 through 4, wherein the injection nozzle has an opening with a shape of a slit or a pinhole.

The present invention is a method of manufacturing a mask blank substrate according to any one of Configurations 6 through 8 below.

Configuration 6

Configuration 6 is a method of manufacturing a mask blank substrate, comprising cleaning at least one surface of the substrate in the method of cleaning the substrate according to any one of Configurations 1 through 5.

Configuration 7

Configuration 7 is the method of manufacturing the mask blank substrate according to Configuration 6, wherein the substrate comprises a glass material.

Configuration 8

Configuration 8 is the method of manufacturing the mask blank substrate according to Configuration 7, wherein the substrate comprises a synthetic quartz glass or a low thermal expansion glass.

The present invention is a method of manufacturing a mask blank or a mask according to Configurations 9 through 12 below.

Configuration 9

Configuration 9 is a method of manufacturing a mask blank, comprising forming a thin film for forming a transfer pattern on a surface of the mask blank substrate, wherein the mask blank substrate is obtained by the method of manufacturing the mask blank substrate for the mask blank according to any one of Configurations 6 through 8.

Configuration 10

Configuration 10 is a method of manufacturing a reflective mask blank, comprising: forming a multilayer reflective film to reflect exposure light on a surface of a mask blank substrate, wherein the mask blank substrate is obtained by the method of manufacturing the mask blank substrate according to any one of Configurations 6 through 8; and forming a thin film for forming a transfer pattern on the multilayer reflective film.

Configuration 11

Configuration 11 is a method of manufacturing a transfer mask, comprising forming the transfer pattern by patterning the thin film of the mask blank obtained by the method of manufacturing the mask blank according to Configuration 9.

Configuration 12

Configuration 12 is a method of manufacturing a reflective mask, comprising forming the transfer pattern by patterning the thin film of a reflective mask blank obtained by the method of manufacturing a reflective mask blank according to Configuration 10.

The present invention is an apparatus for cleaning a substrate according to any one of Configurations 13 through 17 below.

Configuration 13

Configuration 13 is an apparatus for cleaning a substrate, comprising: a cleaning container; a substrate-fixing-base located in the cleaning container to fix a substrate; a cleaning-liquid-tube having a injection nozzle to supply a cleaning liquid into the cleaning container, wherein the cleaning-liquid-tube is located so as to inject the cleaning liquid from the injection nozzle to the substrate fixed on the substrate-fixing-base; a cleaning-liquid-pressurizing-device connected to the cleaning-liquid-tube to pressurize the cleaning liquid; and a mixing unit to mix bubbles or cleaning particles into the cleaning liquid.

Configuration 14

Configuration 14 is the apparatus for cleaning the substrate according to Configuration 13, wherein the mixing unit is a nozzle for bubble generation to generate the bubble by supplying a gas at a pressure higher than that of the cleaning liquid into the cleaning liquid pressurized in the cleaning-liquid-tube.

Configuration 15

Configuration 15 is the apparatus for cleaning the substrate according to Configuration 13, wherein the mixing unit is a cleaning-particle-mixing-unit to mix the cleaning particle into the cleaning liquid, and the cleaning-particle-mixing-unit is connected to the cleaning-liquid-pressurizing-device to allow the cleaning liquid having the cleaning particle mixed therein to move to the cleaning-liquid-pressurizing-device.

Configuration 16

Configuration 16 is the apparatus for cleaning the substrate according to any one of Configurations 13 through 15, wherein the injection nozzle has an opening with a shape of a slit or a pinhole.

Configuration 17

Configuration 17 is the apparatus for cleaning the substrate according to any one of Configurations 13 through 16, wherein the substrate comprises a glass material.

DETAILED DESCRIPTION OF THE INVENTION

Figure 1:
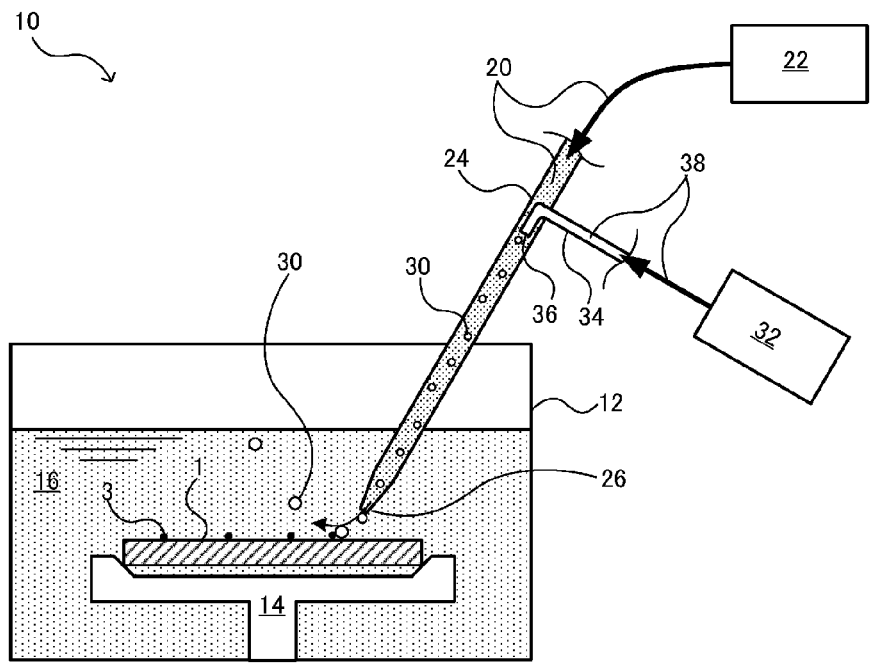
FIG. 1 is a configuration diagram illustrating one example of an apparatus for cleaning substrate of the present invention.

Next, Configurations 1 through 5 of the method of cleaning a substrate of the present invention are described.

The present invention as described in Configuration 1 is a method of cleaning a substrate, comprising cleaning at least one surface of a substrate located in a liquid by injecting pressurized cleaning liquid containing bubbles or cleaning particles from a injection nozzle to at least one surface of the substrate.

As described in Configuration 1, the cleaning method of the present invention is characterized in that pressurized cleaning liquid containing bubbles or cleaning particles is injected from an injection nozzle to at least one surface of a substrate located in a liquid. Since the cleaning liquid is injected from the injection nozzle in a pressurized state, it is possible to detach and remove particles, such as foreign substances in a relatively large size, attached on the surface of the substrate from the substrate. Further, since the cleaning liquid contains bubbles or cleaning particles, the bubble or the cleaning particle can directly hit foreign substances in a relatively small size, such as particles like foreign substances in a size of, for example, less than 100 nm, attached on the surface of the substrate. As the result, according to the cleaning method of the present invention, it is possible to certainly carry out removal of particles attached on the surface of the substrate.

In the cleaning method of the present invention, in a case that the pressurized cleaning liquid contains bubbles, the pressurized cleaning liquid is injected from the injection nozzle into a liquid with relatively low pressure in which the substrate is located. At this time, the compressed bubble rapidly expands with emitting energy of the pressurization to directly hit particles, such as foreign substances in a relatively small size, attached on the surface of the substrate. As the result, it is possible to certainly carry out removal of particles attached on the surface of the substrate. As the gas, air, nitrogen, and/or an inert gas can be used. From the view of the costs, it is preferred to use air from which particles are removed with a dust filter.

In the cleaning method of the present invention, in a case that the pressurized cleaning liquid contains cleaning particles, the pressurized cleaning liquid is injected and accelerated from the injection nozzle into the liquid in low pressure in which the substrate is located. At this time, since the cleaning particle is accelerated similar to the cleaning liquid, the cleaning particle obtains large momentum. Since this cleaning particle hits the particles, such as foreign substances, attached on the surface of the substrate, it is possible to remove the particles attached on the surface of the substrate.

As the cleaning particle, it is possible to use a particle that has hardness that may not damage the substrate and the particle that is easily soluble to chemicals, such as acid, can be used. Specifically, it is preferred to use a latex particle as the cleaning particle. In a case of using a latex particle, even if the latex particle remains, the remained latex particle can be dissolved when cleaning with acid or the like in a following step.

As the liquid in which the substrate is located, it is possible to use a liquid that is the same type as the cleaning liquid. Specifically, it is possible to use a liquid similar to the cleaning liquid, generally used for cleaning a mask blank substrate, such as ultrapure water, pure water, or deionized water, for example, although it is not limited to those.

Since the substrate subjected to the cleaning is located in the liquid, the pressurized cleaning liquid is injected to the surface of the substrate in the liquid. Therefore, a certain differential pressure is required between the pressure of the injected cleaning liquid and the pressure of the liquid near the substrate surface. The differential pressure between the pressure of pressurization to the cleaning liquid by the cleaning-liquid-pressurizing-device and the pressure of the liquid near the substrate surface is at least 1 atmosphere (atm, 101325 Pa) or more, preferably 3 atmospheres or more, and more preferably 5 atmospheres or more, thereby enabling effective removal of the particles attached on the substrate. The higher differential pressure becomes more effective. However, in a case of the high differential pressure, the cleaning-liquid-pressurizing-device is required to have very high performance. Considering this point, the differential pressure is 20 atmospheres or less, preferably 15 atmospheres or less, and more preferably 12 atmospheres or less.

As described in Configuration 2, the present invention is the method of cleaning a substrate of Configuration 1, wherein the cleaning liquid is pure water.

As described in Configuration 2, as the cleaning liquid, it is preferred to use pure water. By using pure water as the cleaning liquid, it is possible to remove the presence of foreign substances and the like in the cleaning liquid, and it is possible to prevent secondary contamination during cleaning. The pure water may be, for example, ultrapure water and deionized water, but it is not limited to them.

As described in Configuration 3, in the method of cleaning a substrate of the present invention, the cleaning liquid can also further contain a surfactant.

As described in Configuration 3, the cleaning liquid, such as pure water, contains a surfactant, thereby enabling more certain removal of particles from the surface of the substrate.

As described in Configuration 4, in the method of cleaning a substrate of the present invention, the cleaning liquid can also further contain an acidic substance or an alkaline substance.

As described in Configuration 4, the cleaning liquid contains an acidic substance or an alkaline substance, thereby enabling to obtain an effect of cleaning the substrate surface by acid or alkali.

As described in Configuration 5, in the method of cleaning a substrate of the present invention, it is preferred that the injection nozzle has an opening with a shape of a slit or a pinhole.

As described in Configuration 5, in the method of cleaning a substrate of the present invention, the shape of the injection nozzle can be in a shape, such as a slit shape that is a nozzle shape of an elongated rectangular or a pinhole shape that is a nozzle shape of a tiny circular. In a case of a nozzle shape of a slit shape, cleaning can be treated linearly over a wide region, so that the throughput of the cleaning treatment can be increased. In a case of a nozzle shape with a pinhole shape, the cleaning liquid can be injected at a high pressure from a small cross sectional area, so that it is possible to remove particles attached relatively rigidly to the substrate. In addition, it is also possible to use a product having a plurality of pinhole nozzles aligned in one line or in other alignments as the injection nozzle. The shape of the injection nozzle is preferably in a shape of enabling to prevent cavitation hydrodynamically.

Next, Configurations 6 through 8 of a method of manufacturing a mask blank substrate of the present invention are described.

As described in Configuration 6, the present invention is a method of manufacturing a mask blank substrate, comprising cleaning at least one surface of the substrate in the method of cleaning the substrate according to any one of Configurations 1 through 5.

As described in Configuration 6, the method of manufacturing the mask blank substrate of the present invention comprises cleaning of at least one surface of the substrate in the method of cleaning a substrate according to any one of Configurations 1 through 5. According to the method of cleaning the substrate according to any one of Configurations 1 through 5 above, it is possible to certainly remove particles attached on the surface of the substrate. As the result, according to the method of manufacturing the mask blank substrate of the present invention, it is possible to obtain a mask blank substrate with significantly reduced defects due to the particles.

As described in Configuration 7, it is preferred that the present invention is the method of manufacturing the mask blank substrate of Configuration 6, wherein the substrate comprises a glass material.

As described in Configuration 7, the substrate is made of a glass material, thereby enabling to certainly manufacture a mask blank substrate.

As described in Configuration 8, in the method of manufacturing the mask blank substrate of the present invention, it is preferred that the substrate comprises a synthetic quartz glass or a low thermal expansion glass.

As described in Configuration 8, it is preferred to use a synthetic quartz glass or a low thermal expansion glass as a material for the substrate. A synthetic quartz glass has characteristics, such as being chemically stable and having an extremely small thermal expansion coefficient in comparison with other materials. The synthetic quartz glass is also high in light transparency to exposure light of an extrahigh pressure mercury lamp used for a transfer mask in an FPD (Flat Panel Display) manufacturing application. Further, the synthetic quartz glass is also high in light transparency to exposure light of a KrF excimer laser having a wavelength of approximately 248 nm and an ArF excimer laser having a wavelength of approximately 193 nm used for a transfer mask in a semiconductor device manufacture application. As seen from these, the synthetic quartz glass can be used preferably as a material for the mask blank substrate.

A low thermal expansion glass is preferably used as a substrate for a reflective mask blank using EUV light as the exposure light. In order to prevent pattern deformation due to the heat at the time of exposure, the low thermal expansion glass has a low thermal expansion coefficient preferably within a range of $0\pm1.0\times10^{-7}/°$ C. and more preferably within a range of $0\pm0.3\times10^{-7}/°$ C. A material having a low thermal expansion coefficient within the ranges may preferably comprise, for example, a $SiO_2$—$TiO_2$ based glass substrate having $TiO_2$ within a range, for example, from about 5 to about 10 weight % added to $SiO_2$, in a case of an amorphous glass. The $SiO_2$—$TiO_2$ based glass having $TiO_2$ added thereto is sometimes difficult to be cleaned with chemicals, so that it is possible to clean preferably in the cleaning method of the present invention.

Next, Configurations 9 and 10 of a method of manufacturing a mask blank of the present invention are described.

As described in Configuration 9, the present invention is a method of manufacturing a mask blank, comprising forming a thin film for forming a transfer pattern on a surface of the mask blank substrate obtained by the method of manufacturing the mask blank substrate according to any one of Configurations 6 through 8.

As described in Configuration 9, in the method of manufacturing the mask blank substrate according to any one of Configurations 6 through 8 above, it is possible to certainly remove particles attached on the surface of the substrate by a predetermined method of cleaning the substrate. As the result, it is possible to obtain a mask blank substrate with significantly reduced defects due to the particles. Therefore, a mask blank with a thin film for pattern formation formed on the mask blank substrate obtained by the method of manufacturing the mask blank substrate according to any one of Configurations 6 through 8 above can also significantly reduce defects due to particles for high yield. The thin film for formation of the transfer pattern on the mask blank substrate can be formed using a known method.

As described in Configuration 10, the present invention is a method of manufacturing a reflective mask blank, comprising: forming a multilayer reflective film to reflect exposure light on a surface of the mask blank substrate obtained by the method of manufacturing the mask blank substrate according to any one of Configurations 6 through 8; and forming a thin film for forming a transfer pattern on the multilayer reflective film.

As described in Configuration 10, in the method of manufacturing the mask blank substrate according to any one of Configurations 6 through 8 above, it is possible to certainly remove particles attached on the surface of the substrate of the reflective mask blank by the predetermined method of cleaning the substrate. As the result, it is possible to obtain a mask blank substrate with significantly reduced defects due to the particles. Therefore, a reflective mask blank having a thin film, an absorber film for example, formed thereon to form a transfer pattern on the multilayer reflective film to reflect exposure light formed on a surface of a mask blank substrate obtained by the method of manufacturing the substrate for the mask blank according to any one of Configurations 6 through 8, can also significantly reduce defects due to particles and it is possible to obtain high yield for reflective mask blanks. The multilayer reflective film and the thin film for formation of the transfer pattern on the mask blank substrate can be formed using a known method.

Next, Configurations 11 and 12 of a method of manufacturing a mask of the present invention are described.

The present invention as described in Configuration 11 is a method of manufacturing a transfer mask, comprising forming the transfer pattern by patterning the thin film of the mask blank obtained by the method of manufacturing the mask blank of Configuration 9.

As described in Configuration 11, the mask blank obtained by the method of manufacturing the mask blank of Configuration 9 can significantly reduce defects due to particles for high yield. Therefore, the transfer mask having a transfer pattern formed on the thin film of the mask blank obtained by Configuration 9 can also significantly reduce defects due to particles for high yield. The formation of the transfer pattern to the thin film of the mask blank can be carried out using a known method.

The present invention as described in Configuration 12 is a method of manufacturing a reflective mask, comprising forming the transfer pattern by patterning the thin film of a reflective mask blank obtained by the method of manufacturing a reflective mask blank of Configuration 10.

As described in Configuration 12, the reflective mask blank obtained by the method of manufacturing a reflective mask blank of Configuration 10 can significantly reduce defects due to particles for high yield. Therefore, the reflective mask having a transfer pattern formed on the thin film of the reflective mask blank obtained by Configuration 10 can also significantly reduce defects due to particles for high yield. The formation of the transfer pattern on the thin film of the reflective mask blank can be carried out using a known method.

Next, Configurations 13 through 17 of an apparatus for cleaning substrate of the present invention are described.

As described in Configuration 13, the present invention is an apparatus for cleaning substrate, comprising: a cleaning container; a substrate-fixing-base located in the cleaning container to fix a substrate; a cleaning-liquid-tube having a injection nozzle to supply a cleaning liquid into the cleaning container, wherein the cleaning-liquid-tube is located so as to inject the cleaning liquid from the injection nozzle to the substrate fixed on the substrate-fixing-base; a cleaning-liquid-pressurizing-device connected to the cleaning-liquid-tube to pressurize the cleaning liquid; and a mixing unit to mix bubbles or cleaning particles into the cleaning liquid.

As described in Configuration 13, the apparatus for cleaning substrate of the present invention comprises a cleaning container, a substrate-fixing-base, a cleaning-liquid-tube, a cleaning-liquid-pressurizing-device, and a mixing unit.

It is preferred that the cleaning container has a size sufficient to maintain the liquid and to have the substrate located on the substrate-fixing-base. In order to avoid contamination in the liquid, the material for the cleaning container is preferably a material not emitting a contaminant, particles, and the like in the liquid.

Figure 3:
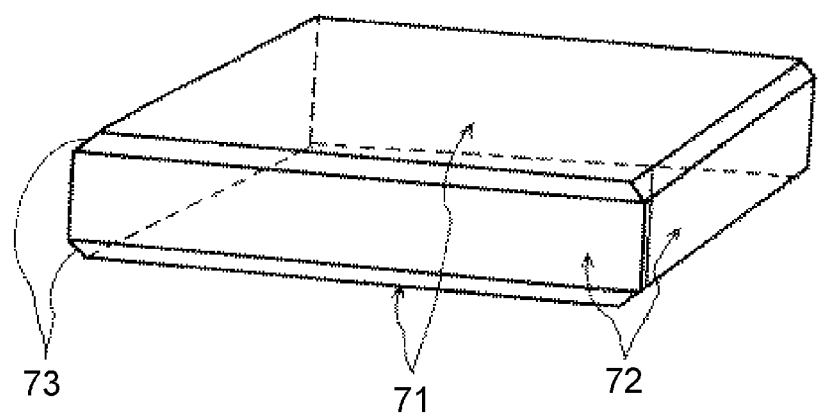
FIG. 3 is a schematic diagram illustrating a mask blank substrate that can be used for a manufacturing method of the present invention.

The substrate-fixing-base is located in the cleaning container. The substrate-fixing-base enables to fix the substrate in the cleaning container. The fixation of the substrate by the substrate-fixing-base can be carried out by a known mechanism, such as a known spin chuck, for example. The substrate-fixing-base can have a rotatable structure using an electric motor. It is also possible to clean the two main surfaces of the substrate at the same time by using two injection nozzles. The two main surfaces of the substrate mean the two "main surfaces 71" facing to each other as shown in FIG. 3.

The cleaning-liquid-tube comprises an injection nozzle to supply a cleaning liquid into the cleaning container. The injection nozzle is located to inject the cleaning liquid to the substrate fixed on the substrate-fixing-base. It can be configured that, while cleaning, the position of the injection nozzle can be moved by, for example, swinging between the center of the substrate and the edge surfaces while rotating the substrate at a predetermined rotation speed. As the result, in a case that the substrate-fixing-base has a rotatable structure, it is possible to inject the cleaning liquid to the entire surface of the substrate from the injection nozzle by rotation of the substrate-fixing-base and by moving the injection nozzle. It is also possible to have a structure with a fixed injection nozzle and the structure that allows the substrate rotated and/or moved. It is also possible to have a structure of injecting the cleaning liquid by fixing the substrate and to move the injection nozzle. Further, it is also possible to have a structure of moving the injection nozzle only to allow the cleaning liquid to be injected to the entire substrate and the structure with the substrate fixed.

The cleaning-liquid-pressurizing-device is a device to pressurize the cleaning liquid. The cleaning-liquid-pressurizing-device is connected to the cleaning-liquid-tube. As the result, the cleaning liquid pressurized by the cleaning-liquid-pressurizing-device can be injected through the cleaning-liquid-tube from the injection nozzle into the cleaning container.

The mixing unit is configured to mix bubbles or cleaning particles into the cleaning liquid. The mixing unit can be configured to mix bubbles or cleaning particles into the pressurized cleaning liquid. The mixing unit can be configured to mix bubbles or cleaning particles into the cleaning liquid before pressurization.

As described in Configuration 14, in the apparatus for cleaning substrate of the present invention, it is preferred that the mixing unit is a nozzle for bubble generation to generate the bubble by supplying a gas at a pressure higher than that of the cleaning liquid, into the cleaning liquid pressurized in the cleaning-liquid-tube.

As described in Configuration 14, in the apparatus for cleaning substrate of the present invention, bubbles can be generated in the cleaning liquid by supplying a gas at a pressure higher than that of the cleaning liquid, into the cleaning liquid from the nozzle for bubble generation. The bubble is injected from the injection nozzle to the substrate together with the cleaning liquid. As the result, it is possible to remove particles attached on the substrate surface. The gas can be pressurized using a known gas pressurizer, such as a compressor.

As described in Configuration 15, in the apparatus for cleaning substrate of the present invention, it is preferred that the mixing unit is a cleaning-particle-mixing-unit to mix the cleaning particle into the cleaning liquid, and the cleaning-particle-mixing-unit is connected to the cleaning-liquid-pressurizing-device to allow the cleaning liquid having the cleaning particle mixed therein to move to the cleaning-liquid-pressurizing-device.

As described in Configuration 15, the apparatus for cleaning substrate of the present invention can mix cleaning particles into the cleaning liquid by comprising a cleaning-particle-mixing-unit to mix cleaning particles into the cleaning liquid. Since the cleaning-particle-mixing-unit is connected to the cleaning-liquid-pressurizing-device, the cleaning liquid having the cleaning particle mixed therein can be pressurized and injected from the injection nozzle to the substrate. As the result, it is possible to remove particles attached on the substrate surface. The cleaning particle can be mixed into the cleaning liquid immediately before use, or the cleaning particle is mixed in the cleaning liquid in advance and the cleaning liquid with the cleaning particle can be set in the apparatus for cleaning substrate.

As described in Configuration 16, in the apparatus for cleaning substrate of the present invention, it is preferred that the injection nozzle has an opening with a shape of a slit or a pinhole.

As described in Configuration 16, in the method of cleaning a substrate of the present invention, the shape of the injection nozzle can be in a shape, such as a slit shape that is a nozzle shape of an elongated rectangular shape or a pinhole shape that is a nozzle shape of a tiny circular shape. In a case of a nozzle shape of a slit shape, cleaning can be treated linearly over a wide region, so that the throughput of the cleaning treatment can be improved. In a case of a nozzle shape with a pinhole shape, the cleaning liquid can be injected at a high pressure from a small cross sectional area, so that it is possible to remove particles attached relatively rigidly to the substrate. In addition, it is also possible to use a product having a plurality of pinhole nozzles aligned in one line or in other alignments as the injection nozzle. The shape of the injection nozzle is preferably in a shape of enabling to prevent cavitation hydrodynamically.

The material for the injection nozzle can be a predetermined material selected from known metal materials and polymer materials. In a case that the cleaning liquid contains cleaning particles, it is possible to select an abrasion resistant material in accordance with the hardness of the cleaning particle and the like. In a case of using a relatively soft latex particle or the like as the cleaning particle, it is possible to use a material having not so much abrasion resistance, such as a polymer material.

As described in Configuration 17, in the apparatus for cleaning substrate of the present invention, it is preferred that the substrate is made of a glass material.

As described in Configuration 17, the apparatus for cleaning substrate of the present invention can preferably be used for cleaning of a substrate made of a glass material, such as a mask blank substrate.

According to the method of cleaning a substrate of the present invention, it is possible to provide a method of cleaning a substrate, such as a mask blank substrate that can certainly remove minute particles attached on the main surface of the substrate while cleaning the mask blank substrate. By using the cleaning method, it is also possible to provide a method of manufacturing a mask blank substrate, a method of manufacturing a mask blank, a method of manufacturing a reflective mask, and a method of manufacturing a transfer mask.

In addition, according to the apparatus for cleaning substrate of the present invention, it is possible to provide an apparatus for cleaning substrate used for a method of cleaning a substrate, such as a mask blank substrate, wherein the apparatus for cleaning substrate can certainly remove minute particles attached on the main surface of the substrate while cleaning the mask blank substrate.

In addition, according to the present invention, it is possible to provide a substrate with a multilayer reflective film and a reflective mask blank that are high quality with reduced number of tiny convex defects to satisfy high level demands for defect quality, and a method of manufacturing the same. According to the manufacturing method of the present invention, it is possible to inhibit generation of defects due to particles on the main surface of the substrate. Therefore, according to the manufacturing method of the present invention, it is possible to prevent occurrence of anomalies of transmissivity and anomalies of phase in the transfer mask. In addition, according to the manufacturing method of the present invention, it is possible to prevent occurrence of anomalies in the reflective mask.

A detailed description of embodiments of the present invention is given below.

As the invention of Configuration 1 above, the present invention is a method of cleaning a substrate, comprising cleaning at least one surface of a substrate located in a liquid by injecting pressurized cleaning liquid containing bubbles or cleaning particles from an injection nozzle to at least one surface of the substrate.

Although a substrate is not limited particularly, the method of the present invention can preferably be used for cleaning of a mask blank substrate made of a glass material, particularly a substrate for a reflective mask blank.

The mask blank substrate is not particularly limited as long as it has transparency to an exposure wavelength to be used. In the present invention, it is possible to use a quartz substrate and other various glass substrates, for example, a substrate of a soda lime glass, an aluminosilicate glass, or the like. Among these substrates, a quartz substrate particularly has high transparency to light of an ArF excimer laser or in a region of shorter wavelength than the ArF excimer laser, so that it is preferred as a substrate for a binary mask blank or a substrate for a phase shift mask blank used for formation of a high definition transfer pattern. A description herein is given with an example of using a glass substrate as the mask blank substrate. Accordingly, a mask blank substrate herein may also be referred to as a glass substrate.

As a substrate for a reflective mask blank using EUV light for the exposure light, a low thermal expansion glass can be used preferably. The low thermal expansion glass preferably has a low thermal expansion coefficient within a range of $0 \pm 1.0 \times 10^{-7}/°C$., more preferably within a range of $0 \pm 0.3 \times 10^{-7}/°C$. to prevent pattern deformation due to the heat at the time of exposure. As a material having a low thermal expansion coefficient within this range, in a case of an amorphous glass, for example, a $SiO_2$—$TiO_2$-based glass substrate that can be used preferably, has $TiO_2$ added within a range, for example, from about 5 to about 10 weight %.

In the steps of manufacturing a glass substrate for a mask blank, after a polishing step, a cleaning step is performed for removing particles on a glass substrate surface, such as foreign substances like abrasive particles attached to the substrate surface, for example.

In the polishing step, a polishing pad is made contact with the surface of the mask blank substrate, which is a glass substrate. Then, a polishing solution containing abrasive particles is supplied to the surface of the glass substrate, and the glass substrate and the polishing pad are relatively moved in order to polish the surface of the glass substrate. For example, the glass substrate is pressed against a polishing platen with a polishing pad adhered thereto, and the polishing platen and the glass substrate are relatively moved while supplying a polishing solution containing abrasive particles. By moving the polishing pad and the substrate relatively, the surface of the glass substrate is polished. As the abrasive particles, colloidal silica is used preferably for at least final polishing in a precision polishing step because good smoothness and flatness of the glass substrate are obtained. For this polishing step, it is possible to use, for example, a double side polishing machine with a planetary gear system and the like.

Figure 2:
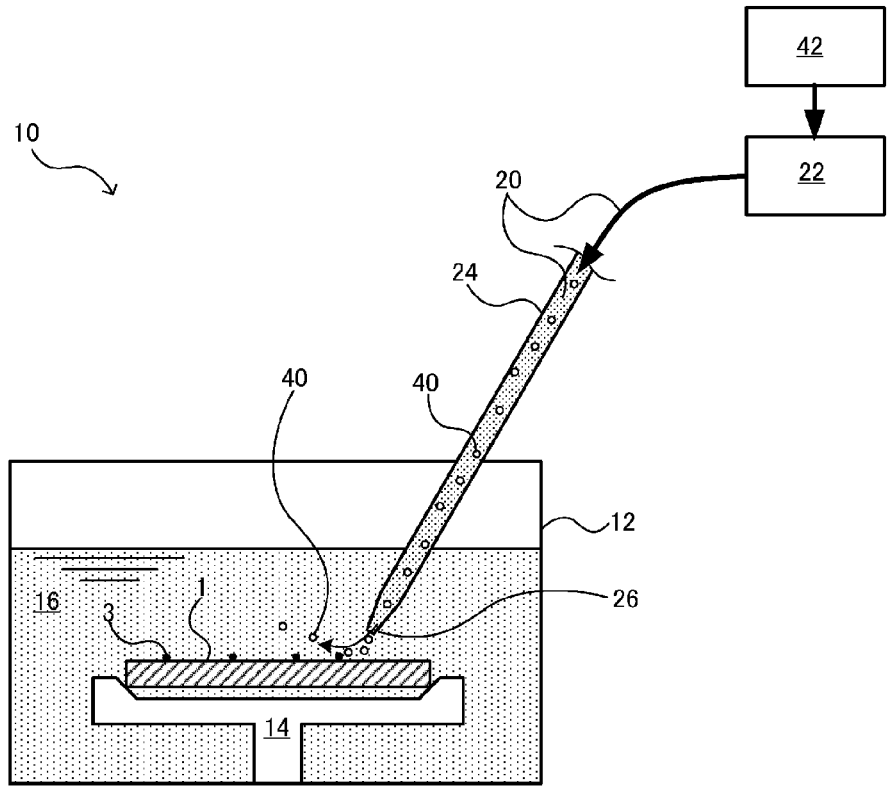
FIG. 2 is a configuration diagram illustrating another example of an apparatus for cleaning substrate of the present invention.

After the polishing step, a cleaning step based on the method of cleaning a substrate of the present invention can be performed. FIGS. 1 and 2 are configuration diagrams illustrating examples of an apparatus for cleaning substrate 10 used in the cleaning step of the present invention. After the polishing step, a cleaning step is performed that comprises cleaning of at least one surface of a substrate 1 by injecting pressurized cleaning liquid 20 containing bubbles 30 or cleaning particles 40 from a injection nozzle 26 towards at least one surface of the substrate 1 located in a liquid 16. Since the cleaning liquid 20 is injected from the injection nozzle 26 in a pressurized state, particles 3, such as foreign substances, attached to the surface of the substrate 1 can be detached from the substrate 1. Further, since the cleaning liquid 20 contains the bubbles 30 or the cleaning particles 40, it is possible to certainly remove the particles 3, such as foreign substances, like silica particles, attached to the surface of the substrate 1 remained in the polishing step, for example.

Because of higher density and higher precision of electronic devices in recent years, miniaturization of transfer mask patterns is progressing. As the result, the demands for the surface smoothness and the surface defect of a mask blank substrate are becoming severer, year by year, and the inspection accuracy of defect inspection apparatus has become improved. Therefore, even a surface defect in a small size that could not be found with a conventional inspector, a surface defect having a particle size equivalent to 60 nm, for example, is becoming detected. A mask blank substrate with such a tiny surface defect should not be accepted.

According to the present invention, a removal rate of particles having a particle size equivalent to 60 nm or more on the surface of the substrate 1 after cleaning is obtained as high as 98% or more relative to before cleaning. Here, the removal rate of particles is a value calculated by the following relational expression.

Removal Rate (%)=[(Number of Particles before Cleaning−Number of Particles after Cleaning)/Number of Particles before Cleaning]×100

Specifically, using a micro-particle-applicator, particles having a plurality of known particle sizes are applied on the substrate 1. For example, polystyrene latex particles having a plurality of particle sizes of 60 nm or more are applied on the substrate 1 at a predetermined application density. The polystyrene latex particles herein may also be referred to as PSL particles. The PSL particles have a property that there is a probability of 1% or less to have the particles coming close to each other within 1 mm. Next, the number of particles before cleaning is detected using a defect inspection apparatus of, for example, sensitivity of 60 nm. The defect inspection apparatus of sensitivity of 60 nm in this context means a defect inspection apparatus that can detect the PSL particles, even when the defect inspection apparatus carries out defect inspection to a specimen with scattered PSL particles having a particle size of 60 nm on the substrate 1. After cleaning the substrate 1, the number of particles is detected similarly using the defect inspection apparatus. From the results, the removal rate of the particles due to cleaning is calculated by the relational expression.

In a case of obtaining a removal rate of particles for each particle size, and not in a case of the removal rate of the entire particles comprising a plurality of particle sizes as above, only particles having a plurality of known particle sizes are applied on the identical substrate 1 using a particle size microparticle-applicator. For example, PSL particles having particle sizes of 60 nm, 90 nm, 120 nm, 150 nm, and 200 nm are applied on the identical substrate 1 at a predetermined application density separately in respective regions. Then, the number of particles before cleaning for each particle size is detected using a defect inspection apparatus of sensitivity of 60 nm, for example. After cleaning the substrate 1, the number of particles for each particle size is similarly detected using the defect inspection apparatus. From the results, by the relational expression, the removal rate by cleaning of the particles for each particle size is calculated. According to the present invention, with regards to the particles having a particle size equivalent to 60 nm or more, 98% or more of the particle removal rate is obtained for any particle size.

The apparatus for cleaning substrate 10 shown in FIG. 1 is configured with a cleaning container 12, a substrate-fixing-base 14 to place and to fix the substrate 1 thereon to prevent moving the substrate 1, a cleaning-liquid-tube 24 having an injection nozzle 26, and a cleaning-liquid-pressurizing-device 22 to pressurize the cleaning liquid 20. The substrate-fixing-base 14 is located in the cleaning container 12, and the cleaning-liquid-tube 24 is located to allow the cleaning liquid 20 to be injected from the injection nozzle 26 to the substrate. In order to avoid contamination in the liquid 16, the material of the cleaning container 12 is preferably a material not emitting contaminants, particles, and the like in the liquid 16.

When locating the substrate 1 in the liquid 16, the substrate 1 is located on the substrate-fixing-base 14 to be fixed not to move the substrate 1 by the injection of the pressurized cleaning liquid 20. At this time, it is preferred that the substrate 1 is located on the substrate-fixing-base 14 with avoiding contact between a main surface 71 of the substrate 1 and the substrate-fixing-base 14. A known structure, for example, a known spin chuck and the like can be used for the substrate-fixing-base 14. The substrate-fixing-base 14 can have a rotatable structure using an electric motor. The cleaning fluid supplied from the cleaning-liquid-tube 24 can be injected to the main surface 71 of the substrate 1 by the injection nozzle 26. Using two injection nozzles 26, it is also possible to clean the two main surfaces 71 of the substrate 1 at the same time. The main surfaces 71 of the substrate 1 mean, as exemplified in FIG. 3, the surfaces except the substrate peripheral areas. The substrate peripheral areas refer to edge surfaces 72 and chamfered faces 73 exemplified in FIG. 3. The main surfaces 71 of the substrate 1 are surfaces shown as the two facing main surfaces 71.

In the example of FIG. 1, the cleaning liquid 20 contains bubbles 30. Since the cleaning liquid 20 containing the bubbles 30 is pressurized by the cleaning-liquid-pressurizing-device 22, the particles 3 on the main surface 71 of the substrate can be removed by the cleaning liquid 20 and the bubbles 30 injected from the injection nozzle 26.

An apparatus for cleaning substrate 10 shown in FIG. 2 is configured with, similar to the case of FIG. 1, a cleaning container 12, a substrate-fixing-base 14 to place and to fix the substrate 1 thereon to prevent moving the substrate 1, a cleaning-liquid-tube 24 having an injection nozzle 26, and a cleaning-liquid-pressurizing-device 22 to pressurize the cleaning liquid 20. In the example of FIG. 2, the cleaning liquid 20 contains cleaning particles 40. Since the cleaning liquid 20 containing the cleaning particles 40 is pressurized by the cleaning-liquid-pressurizing-device 22, the particles 3 on the main surface 71 of the substrate can be removed by the cleaning liquid 20 and the cleaning particles 40 injected from the injection nozzle 26.

Although FIG. 1 shows an example of the cleaning liquid 20 containing the bubbles 30 and FIG. 2 shows an example of the cleaning liquid 20 containing the cleaning particles 40, the cleaning liquid 20 can also contain both the bubbles 30 and the cleaning particles 40. The apparatus for cleaning substrate 10 can also comprise at least one mechanism to mix both the bubbles 30 and the cleaning particles 40 into the cleaning liquid 20.

The cleaning-liquid-pressurizing-device 22 is a device to pressurize the cleaning liquid 20. The cleaning-liquid-pressurizing-device 22 is connected to the cleaning-liquid-tube 24. As the cleaning-liquid-pressurizing-device 22, a high pressure pump and the like can be used. As the result, the cleaning liquid 20 pressurized by the cleaning-liquid-pressurizing-device 22 can be injected from the injection nozzle 26 into the cleaning container 12 through the cleaning-liquid-tube 24. The pressure of pressurizing the cleaning liquid 20 by the cleaning-liquid-pressurizing-device 22, in terms of a differential pressure compared to the pressure of the liquid near the substrate surface, is at least 1 atmosphere (atm, 101325 Pa) or more, preferably 3 atmospheres or more, and more preferably 5 atmospheres or more, thereby enabling effective removal of the particles 3 attached to the substrate 1. An upper limit of the differential pressure is 20 atmospheres or less, preferably 15 atmospheres, and more preferably 12 atmospheres.

In a mixing unit, the bubbles 30 or the cleaning particles 40 are mixed into the cleaning liquid 20. As an example of the mixing unit, FIG. 1 shows bubbles generation nozzle 36. In the apparatus for cleaning substrate 10 shown in FIG. 1, a gas introduction tube 34 is inserted to the cleaning-liquid-tube 24 to introduce a gas 38 into the cleaning liquid 20 from the bubble generation nozzle 36 at a tip end of the gas introduction tube 34 located in the cleaning-liquid-tube 24, thereby obtaining a structure being enabled to mix the bubbles 30 into the cleaning liquid 20. By pressurizing the gas 38 at a pressure higher than that of the cleaning liquid 20, it is possible to introduce the gas 38 into the cleaning liquid 20 for generation of the bubbles 30. The mixing unit can also have a structure of mixing the bubbles 30 into the cleaning liquid 20 before pressurization. As the gas 38, air, nitrogen, and/or an inert gas can be used. From the view of the costs, as the gas 38, it is preferred to use air from which particles are removed with a dust filter.

As another example of the mixing unit, the apparatus for cleaning substrate 10 shown in FIG. 2 has a structure of a cleaning-particle-mixing-unit 42 to allow the cleaning particles 40 to be mixed into the cleaning liquid 20. The cleaning liquid 20 having the cleaning particles 40 mixed thereto in the cleaning-particle-mixing-unit 42 is pressurized by the cleaning-liquid-pressurizing-device 22, and supplied to the cleaning-liquid-tube 24. The mixing unit can also have a structure of mixing the cleaning particles 40 into the cleaning liquid 20 after pressurization.

During cleaning of the substrate 1, while rotating the substrate 1 at a predetermined rotation speed, a position of the injection nozzle 26 can be configured to move, for example, by swinging between the center and the edge surface of the substrate 1. It is also possible to have a structure with a fixed injection nozzle 26 and the structure that allows the substrate rotated and/or moved, and also it is also possible to have a structure with a fixed substrate 1 and the structure with the injection nozzle 26 fixed so that the cleaning liquid 20 can be injected to the entire substrate 1.

As the cleaning liquid 20 in this case, it is preferred to use pure water, such as ultrapure water, pure water, and deionized water, for example. A conventional cleaning fluid containing an acidic substance or an alkaline substance, such as a sulfuric acid peroxide mixture and an ammonia peroxide mixture, can also be used. However, in a case of using an acidic or alkaline cleaning fluid, the smoothness and the flatness of the surface of the glass substrate 1 obtained by polishing are sometimes degraded, so that it is preferred to use pure water. As the cleaning liquid 20, it is also possible to use hydrogen gas dissolved water, $O_2$ gas dissolved water, $O_3$ gas dissolved water, noble gas dissolved water, $N_2$ gas dissolved water, or the like.

In a case of using the apparatus for cleaning substrate 10, the rotation speed of the substrate 1 and the moving speed of the injection nozzle 26 while cleaning are preferably set at predetermined values so as to uniformly clean the entire substrate 1. The injection nozzle 26 in the apparatus for cleaning substrate 10 can use any shape of the tip end thereof, such as a circular shape, a rectangular shape like a slit shape, for example. In order to certainly inject the cleaning liquid 20 in a pressurized state from the injection nozzle 26, the injection nozzle 26 preferably has a shape of an opening with a shape of a slit or a pinhole.

As the above description, according to the method of manufacturing the mask blank substrate of the present invention, the cleaning liquid 20 containing the bubbles 30 or the cleaning particles 40 is pressurized by the cleaning-liquid-pressurizing-device 22, so that the particles 3 on the main surface 71 of the substrate can be removed certainly by the cleaning liquid 20 and the bubbles 30 injected from the injection nozzle 26.

The method of cleaning a substrate of the present invention described above can be used preferably as a cleaning step of a method of manufacturing a mask blank substrate. The method of cleaning a substrate of the present invention is also applicable to cleaning step in a method of manufacturing a mask blank and a method of manufacturing a reflective mask blank.

The method of manufacturing the mask blank substrate of the present invention and the method of manufacturing the mask blank of the present invention explained above are particularly preferred for manufacture of a mask blank substrate and a mask blank used to fabricate a transfer mask used for an exposure apparatus with exposure light having a short wavelength of 200 nm or less as an exposure light source requiring a miniaturized transfer pattern. As a demand for pattern miniaturization is becoming more and more, a demand for the surface defect of a mask blank substrate and a mask blank has also become extremely severe. For example, in a case of fabricating, for example, a phase shift mask using a mask blank with concave defects due to generation of the latent defects described above or convex defects due to attachment of foreign substances or the like on a surface of a glass substrate, a change in the phase angle and a decrease in the transmissivity due to the concave defects and the convex defects occur in a transmitted light of the exposure light. The change in the phase angle and the decrease in the transmissivity cause deterioration in the positional accuracy and the contrast of the transferred pattern. Particularly in a case of using light having a short wavelength, such as an ArF excimer laser having a wavelength of approximately 193 nm as the exposure light, the change in the phase angle becomes very sensitive to the minute concave defects on the mask surface, so that the influence of the transfer image increases. Accordingly, the changes in the phase angle and the transmissivity derived from the minute concave defects are important problems that are not negligible at all.

In a case of binary mask as well, when light having a short wavelength, such as an ArF excimer laser having a wavelength of approximately 193 nm, is used as exposure light, it becomes an important problems to have a minute surface defect on the substrate surface. This is because, when there is a minute surface defect on the substrate surface, the influence to the transmissivity increases. According to the present invention, it is possible to prevent generation of a minute surface defect, such as a convex defect, due to attachment of particles, such as foreign substances, so that it is preferred for fabrication of a transfer mask used for an exposure apparatus with exposure light having a short wavelength of 200 nm or less requiring a miniaturized transfer pattern as an exposure light source.

A multitone mask used for manufacture of flat panel displays and the like is configured to have regions of at least three different transmissivity coexisted on a glass substrate that are light shielding area to shield exposure light, a light-semi-transmitting area to transmit exposure light at a predetermined transmissivity, and a transparent area to transmit exposure light at a high transmissivity. A flat panel display herein may also be referred to as an FPD. In recent years, a multitone mask provided with two types or more of a light-semi-transmitting area having different transmissivity is also used. Therefore, control of the transmissivity for exposure light is very important, and the presence of latent defects described above on a surface of a glass substrate, generation of concave defects due to the latent defects, and the presence of convex defects due to attachment of foreign substances are the problems to be avoided. According to the present invention, generation of a minute surface defect, such as a convex defect due to attachment of particles like foreign substances, can be prevented, so that it is preferred to fabricate a multitone mask.

The cleaning method of the present invention is preferred for a mask blank substrate used to manufacture the following mask blanks, for example.

Substrate a: Binary Mask Blank having Thin Film being Light Shielding Film Made of Material Containing Transition Metal This binary mask blank has a configuration comprising light shielding film on a transparent substrate, and this light shielding film is made of a material containing an elemental substance of transition metal, such as chromium, tantalum, ruthenium, tungsten, titanium, hafnium, molybdenum, nickel, vanadium, zirconium, niobium, palladium, and/or rhodium or a compound thereof. For example, a light shielding film may be composed of chromium or a chromium compound having one or more elements selected from the elements, such as oxygen, nitrogen, and carbon, added to chromium. A light shielding film may also be composed of, for example, a tantalum compound having one type or more elements selected from the elements, such as oxygen, nitrogen, and boron, added to tantalum.

This binary mask blank comprises those having a light shielding film with two layer structures of light shielding layer and a surface antireflection layer, those having a three layer structure with a back surface antireflection layer between the light shielding layer and the substrate further in addition to the two layer structure, and the like.

The light shielding film can be a composition gradient film having composition varying continuously or gradually across the film thickness.

Substrate b: Phase Shift Binary Mask Blank having Thin Film above being Light-semi-transmitting Film Made of Material Containing Transition Metal and Silicon Compound, that is, Material Containing Transition Metal Silicide Compound, Particularly Molybdenum Silicide Compound As this phase shift mask blank, a halftone phase shift mask has a form comprising a light-semi-transmitting film on a transparent substrate, such as a glass substrate, and a shifter area is produced by patterning the light-semi-transmitting film. This phase shift mask may have a configuration comprising a light-semi-transmitting film on a transparent substrate and light shielding film that is light shielding band on the light-semi-transmitting film, in order to prevent a pattern failure in a transferred substrate by a light-semi-transmitting film pattern formed in a transfer region based on light transmitted through the light-semi-transmitting film. Other than a halftone phase shift mask blank, it may also comprise mask blanks of a Levenson phase shift mask, which is a substrate embedded type with a shifter area embedded in a transparent substrate by etching or the like, and an enhancer type phase shift mask.

The light-semi-transmitting film of the halftone phase shift mask blank transmits light with an intensity substantially not contributing to exposure, for example, light with an intensity from 1% to 30% relative to light of the exposure wavelength and has a predetermined phase difference, for example, a phase difference of 180 degrees. It may be possible to have an inverse relationship between a phase of light transmitted through a light-semi-transmitting area made by patterning the light-semi-transmitting film and a phase of light, with intensity substantially contributing to exposure, transmitted through a transparent area without the light-semi-transmitting film formed therein. The light transmitted through the light-semi-transmitting area and the light transmitted through the transparent area are diffracted to the other regions each other due to the diffraction of light. Since the respective phases of the light transmitted through the light-semi-transmitting area and the light transmitted through the transparent area are in the inverse relationship, both lights cancel each other. As the result, light intensity at a boundary between the light-semi-transmitting area and the transparent area can be almost zero, and a contrast of the light at the boundary, which is resolution, is improvement.

The material for this light-semi-transmitting film may comprise a material containing, for example, a compound of transition metal and silicon, that is, a transition metal silicide compound. Specifically, the material for the light-semi-transmitting film may comprise a material having main components of the transition metal and silicon with oxygen and/or nitrogen. The transition metal can be selected from molybdenum, tantalum, tungsten, titanium, hafnium, nickel, vanadium, zirconium, niobium, palladium, ruthenium, rhodium, chromium, and an alloy thereof.

Since the material for the light-semi-transmitting film contains transition metal and silicon, in a case of a configuration comprising light shielding film on the light-semi-transmitting film, the material for the light shielding film is preferably a material having etching selectivity to the light-semi-transmitting film, that is, a material having etching resistance. The material for the light shielding film having etching resistance is particularly preferably chromium or a chromium compound having elements, such as oxygen, nitrogen, and/or carbon, added to chromium.

The Levenson phase shift mask is produced using a mask blank having a similar configuration to a binary mask blank. Accordingly, the structure of the thin film for pattern formation of the Levenson phase shift mask is similar to that of the light shielding film of the binary mask blank. The light-semi-transmitting film of the mask blank for an enhancer type phase shift mask transmits light with intensity that does not contribute to exposure substantially, for example, light with intensity from 1% to 30% relative to light of the exposure wavelength, which is the same as the light-semi-transmitting film of the halftone phase shift mask blank. However, the light-semi-transmitting film of the mask blank for the enhancer type phase shift mask is the film that has a small phase difference generated in the transmitting exposure light, for example, having a phase difference of 30 degrees or less, preferably a phase difference of 0 degrees, which is different from the light-semi-transmitting film of the halftone phase shift mask blank. Although the material for the light-semi-transmitting film of the mask blank for the enhancer type phase shift mask contains the elements similar to the light-semi-transmitting film of the halftone phase shift mask blank, the composition ratio of each element and the film thickness are adjusted to be a predetermined transmissivity and a predetermined small phase difference relative to the exposure light.

Substrate c: Binary Mask Blank having Thin Film being Light Shielding Film Made of Transition Metal, Material Containing Compound of Transition Metal and Silicon, particularly, Material Containing Transition Metal Silicide, more particularly Molybdenum Silicide This light shielding film may comprise a material containing a compound of transition metal and silicon. Specifically, the material for the light shielding film may comprise a material having main components of the transition metal and silicon with oxygen and/or nitrogen. The material for the light shielding film may also comprise a material having main components of transition metal with oxygen, nitrogen, and/or boron. The usable transition metals may comprise molybdenum, tantalum, tungsten, titanium, hafnium, nickel, vanadium, zirconium, niobium, palladium, ruthenium, rhodium, chromium, and the like.

Particularly in a case of forming the light shielding film with a molybdenum silicide compound, the light shielding film may have a two layer structure of light shielding layer of MoSi or the like and a surface antireflection layer of MoSiON or the like and may also have a three layer structure of a back surface antireflection layer of MoSiON or the like between the light shielding layer and the substrate further in addition to the two layer structure.

The light shielding film can be a composition gradient film having composition varying continuously or gradually across the film thickness.

In order to make a fine pattern with thinner film thickness of a resist film, it can also be a configuration having an etching mask film on the light shielding film. This etching mask film preferably has etching selectivity to the etching of the light shielding film containing transition metal silicide, that is, a material having etching resistance. The material for the light shielding film having etching resistance is preferably a material made particularly of chromium or a chromium compound having elements, such as oxygen, nitrogen, and/or carbon, added to chromium. At this time, if the etching mask film has an antireflection function, it is possible to fabricate a transfer mask with remaining the etching mask film on the light shielding film.

Substrate d: Multitone Mask Blank having Thin Film in Lamination Structure of One or More Light-semi-transmitting Film and Light Shielding Film The material for the light-semi-transmitting film of the multitone mask blank may comprise, other than the elements similar to the light-semi-transmitting film of the halftone phase shift mask blank, an elemental substance of metal, such as chromium, tantalum, titanium, and aluminum, or an alloy thereof, and materials containing these compounds. The composition ratio and the film thickness of each element are adjusted to be a predetermined transmissivity relative to the exposure light. The material similar to the light shielding film of the binary mask blank can also be used for the material for the light shielding film of the multitone mask blank. The composition and the film thickness of the light shielding film material can be adjusted in order to obtain predetermined light shielding performance (a predetermined optical density)

of the lamination structure of the light shielding film material and the light-semi-transmitting film.

In Substrates a, b, c, and d above, between the transparent substrate and the light shielding film or between the light-semi-transmitting film and the light shielding film, an etching stopper film having etching resistance to the light shielding film and/or the light-semi-transmitting film can be formed. The material for the etching stopper film can be a material allowing the etching mask film to be stripped at the same time when etching the etching stopper film.

Further, the cleaning method of the present invention can be used particularly preferably for cleaning of a mask blank substrate used to manufacture a reflective mask blank, as follows.

Substrate e: Reflective Mask Blank Provided with Absorber Film on Multilayer Reflective Film Made of Alternately Laminating High Refractive Index Layer and Low Refractive Index Layer The reflective mask is a mask used for EUV lithography. The reflective mask has a structure of forming a multilayer reflective film to reflect exposure light on a substrate and forming an absorber film to absorb exposure light with a pattern shape on a multilayer reflective film. Light, for example, EUV light, introduced to a reflective mask mounted to an exposure apparatus, which is a pattern transfer apparatus, is absorbed in an area with the absorber film and is reflected in an area without the absorber film by the multilayer reflective film. The light image reflected by the multilayer reflective film is transferred onto the semiconductor substrate through an optical system.

The multilayer reflective film is formed by alternately laminating a high refractive index layer and a low refractive index layer. Examples of the multilayer reflective film may comprise an Mo/Si cyclic lamination film made of alternately laminating Mo films and Si films in approximately 40 cycles, an Ru/Si cyclic multilayer film, an Mo/Be cyclic multilayer film, an Mo compound/Si compound cyclic multilayer film, an Si/Nb cyclic multilayer film, an Si/Mo/Ru cyclic multilayer film, an Si/Mo/Ru/Mo cyclic multilayer film, an Si/Ru/Mo/Ru cyclic multilayer film, and the like. It is possible to select a predetermined material, depending on the exposure wavelength.

As the absorber film of the reflective mask, a material having a function of absorbing, for example, EUV light as exposure light can be used preferably. As the absorber film of the reflective mask, a elemental substance of, for example, tantalum expressed by a chemical symbol of Ta or a material containing Ta as a main component can be used preferably. Such an absorber film is preferably in a crystal state of amorphous or microcrystalline structure, from the view of the smoothness and the flatness.

The material containing Ta as a main component may comprise a material containing Ta and B, a material containing Ta and N, a material containing Ta and B and further at least either O or N, a material containing Ta and Si, a material containing Ta, Si, and N, a material containing Ta and Ge, a material containing Ta, Ge, and N, a material containing Ta and Hf, a material containing Ta, Hf, and N, a material containing Ta and Zr, a material containing Ta, Zr, and N, and the like. By adding B, Si, and/or Ge to Ta, it is possible to easily obtain an amorphous material to enable improvement of the smoothness. Since oxidation resistance improves by adding N and/or O to Ta, an effect of enabling improvement of the temporal stability can be obtained.

In a case of the EUV reflective mask blank, it is required to satisfy conditions to a surface defect at a very high level. The method of cleaning a substrate of the present invention can be used particularly preferably to clean a substrate used for an EUV reflective mask blank.

EXAMPLES

Embodiments of the present invention are described in further detail with Examples.

Example 1

For the substrate, a synthetic quartz glass substrate in a size of 152.4 mm×152.4 mm having a thickness of 6.35 mm was used. Edge surfaces of this synthetic quartz glass substrate was processed by chamfering and grinding, and further was treated by rough polishing and precision polishing with a polishing solution containing cerium oxide abrasive particles. The glass substrate finished with these processes, treatments and polishing, was set in a carrier of a double side polishing machine, and it is polished with super precision polishing process with the conditions as follows.

Polishing Pad: Soft polisher of suede type
Polishing Solution: Abrasive particles of colloidal silica having a particle size of 100 nm and water
Processing Pressure: From 50 to 100 g/cm$^2$
Processing Time: 60 minutes After finishing the super precision polishing, the glass substrate was immersed in hydrofluoric acid to carry out cleaning for removal of the abrasive particles of the colloidal silica. Next, the main surfaces and the edge surfaces of the glass substrate were subjected to scrub cleaning and subsequently were subjected to spin cleaning with pure water and spin drying. After spin drying, the main surfaces of the glass substrate was subjected to defect inspection for convex defects and concave defects in a size equivalent to 60 nm or more using a defect inspection apparatus with sensitivity of 60 nm by a laser interference confocal optical system. As the defect inspection apparatus, M6640 manufactured by Lasertec Corporation was used. Next, out of glass substrates subjected to the defect inspection, ten glass substrates with no concave defect detected and with less than ten convex defects detected, equivalent to 60 nm, were selected. Using these selected glass substrates, cleaning capabilities in the cleaning conditions in each Example were evaluated, as follows.

On a main surface of the selected glass substrate, PSL particles having a particle size of 60 nm were scattered as dummy foreign substances. Next, using a defect inspection apparatus of 60 nm sensitivity, M6640 manufactured by Lasertec Corporation, defect inspection was carried out for convex defects and concave defects in a size equivalent to 60 nm or more. As the result, although no concave defect was detected, 3430 convex defects in a size equivalent to 60 nm or more were detected.

Subsequently, the substrate was cleaned using the apparatus for cleaning substrate shown in FIG. 1. As the cleaning liquid, pure water containing bubbles was used. The flow rate of the cleaning liquid containing bubbles injected from the injection nozzle to the surface of the substrate was adjusted to 1.5 liters/minute. The rotation speed of the substrate and the moving speed of the cleaning nozzle during the cleaning were set at predetermined values. Other experimental conditions were as follows.

Pressure of Cleaning Liquid: 5 atmospheres
Type of Gas for Bubble Generation: Air
Flow Rate of Gas Introduced into Cleaning Liquid: 1.0 liter/minute Shape of Injection nozzle: Pinhole like circular shape having diameter of 1 mm Cleaning of the substrate was carried out for five minutes in the above conditions. The main surface of the glass substrate after cleaning was subjected to defect inspection for convex defects and concave defects in a size equivalent to 60 nm or more using the defect inspection apparatus of 60 nm sensitivity, M6640 manufactured by Lasertec Corporation. As the result, although no concave defect was detected, 69 convex defects in a size equivalent to 60 nm or more were detected.

In a similar manner, total ten glass substrates were subjected to scattering of dummy foreign substances, cleaning, and defect inspection.

Regarding the ten glass substrates finished with the above cleaning, the particle removal rate having a particle size equivalent to 60 nm or more on the substrate surface after cleaning was calculated based on the relational expression described above. As the result, a high particle removal rate of 98.0% in average of the ten glass substrates was obtained. Accordingly, it was found that a high cleaning effect was obtained by the cleaning in Example 1.

The ten glass substrates finished with the above cleaning were immersed in an alkaline chemical for 20 minutes and cleaned, followed by the main surfaces of the glass substrates were subjected to again defect inspection using the defect inspection apparatus of 60 nm sensitivity, M6640 manufactured by Lasertec Corporation. As the result, no concave defect was detected for any of the ten substrates. Accordingly, it could be confirmed that no latent defects was generated inside the glass substrates even when the above cleaning of a substrate of the present invention was carried out.

Example 2

Other than cleaning the substrates using pure water containing cleaning particles as the cleaning liquid and using the apparatus for cleaning substrate shown in FIG. 2, ten glass substrates were subjected to scattering of dummy foreign substances, cleaning, and defect inspection in a similar manner to Example 1. The conditions in Example 2 other than the following experimental conditions were similar to those in Example 1.

Pressure of Cleaning Liquid: 5 atmospheres
Type of Cleaning Particle: Latex particle having average particle size of 60 nm
Flow Rate of Gas Introduced into Cleaning Liquid: 1.0 liter/minute
Flow Rate of Cleaning Particle Introduced into Cleaning Liquid: 0.5 liters/minute
Shape of Injection nozzle: Pinhole like circular shape having diameter of 1 mm Cleaning of the substrate was carried out for five minutes in the above conditions. The main surface of the glass substrate after cleaning was subjected to defect inspection for convex defects and concave defects in a size equivalent to 60 nm or more using the defect inspection apparatus of 60 nm sensitivity, M6640 manufactured by Lasertec Corporation. Total ten glass substrates were subjected to scattering of dummy foreign substances, cleaning, and defect inspection.

Regarding the ten glass substrates finished with the above cleaning, the particle removal rate having a particle size equivalent to 60 nm or more on the substrate surface after cleaning was calculated based on the relational expression described above. As the result, a high particle removal rate of 98% in average of the ten glass substrates was obtained. Accordingly, it was found that a high cleaning effect was obtained by the cleaning in Example 2.

The ten glass substrates finished with the above cleaning were immersed in an alkaline chemical for 20 minutes and cleaned, followed by the main surfaces of the glass substrates were subjected to again defect inspection using the defect inspection apparatus of 60 nm sensitivity, M6640 manufactured by Lasertec Corporation. As the result, no concave defect was detected for any of the ten substrates. Accordingly, it could be confirmed that no latent defects was generated inside the glass substrates even when the above cleaning of a substrate of the present invention was carried out.

Comparative Example 1

Other than carrying out cleaning with pure water only as the cleaning liquid instead of cleaning with pure water containing bubbles or cleaning particles for the cleaning of the substrate, the cleaning capabilities were evaluated in a similar manner to Examples 1 and 2.

The defect inspection of the main surface of the substrate before and after cleaning was carried out in a similar manner to Example 1, the particle removal rate having a particle size equivalent to 60 nm or more on the substrate surface after cleaning was calculated based on the relational expression described above. As the result, the particle removal rate was a value of 87% in average of the ten glass substrates and was lower than the particle removal rate in Examples 1 and 2. Accordingly, it was found that a high cleaning effect was obtained by Examples 1 and 2 using the method of cleaning a substrate of the present invention.

What is claimed is:

1. A method of manufacturing a mask blank substrate, comprising:
    cleaning at least one surface of the substrate by injecting pressurized cleaning liquid from an injection nozzle to the at least one surface of the substrate,
    wherein, the cleaning liquid containing bubbles or cleaning particles is supplied to the nozzle with pressurized state,
    wherein the substrate and the nozzle are located in a liquid, and
    wherein the pressurized cleaning liquid is injected from the injection nozzle to the liquid, so that the at least one surface of the substrate is cleaned by the pressurized cleaning liquid that is injected to the liquid.

2. The method of manufacturing the mask blank substrate according to claim 1, wherein the substrate comprises a glass material.

3. The method of manufacturing the mask blank substrate according to claim 2, wherein the mask blank substrate comprises a synthetic quartz glass or a low thermal expansion glass.

4. A method of manufacturing a mask blank, comprising forming a thin film for forming a transfer pattern on a surface of the mask blank substrate, wherein the mask blank substrate is obtained by the method of manufacturing the mask blank substrate according to claim 1.

5. A method of manufacturing a transfer mask, comprising forming the transfer pattern by patterning the thin film of the mask blank obtained by the method of manufacturing the mask blank according to claim 4.

6. A method of manufacturing a reflective mask blank, comprising: forming a multilayer reflective film to reflect exposure light on a surface of the mask blank substrate, wherein the mask blank substrate is obtained by the method of manufacturing the mask blank substrate according to claim 1; and forming a thin film for forming a transfer pattern on the multilayer reflective film.

7. A method of manufacturing a reflective mask, comprising forming the transfer pattern by patterning the thin film of a reflective mask blank obtained by the method of manufacturing the reflective mask blank according to claim 6.

* * * * *